May 2, 1967 E. C. BRODIE 3,317,819

ELECTRONIC HUM AND RIPPLE FILTER

Filed Oct. 3, 1963

Earle C. Brodie

INVENTOR.

BY Clarence A. O'Brien and Harvey B. Jacobson

Attorneys

United States Patent Office 3,317,819

Patented May 2, 1967

3,317,819

ELECTRONIC HUM AND RIPPLE FILTER

Earle C. Brodie, 14901 NW. 5th Ave., Miami, Fla. 33168

Filed Oct. 3, 1963, Ser. No. 313,488
6 Claims. (Cl. 323—22)

This invention relates to an electronic filter and more particularly to means for attenuating hum, ripple and/or transient voltage components associated with a source of voltage to be regulated, or applied to a load.

It is therefore a primary object of the present invention to provide an electrical filter network whereby ripple components caused by rectifier action, commutation or switching type voltage regulators, may be significantly attenuated.

An additional object of the present invention is to provide a multi-transistor stage filter circuit wherein approximately equal attenuation ratio is produced in each stage, over-all attenuation being the product of the attenuation ratio of the respective stages. The multi-stage arrangement utilizes lower gain transistors in each stage thereby obviating the use of more costly transistors necessary for high gain arrangements.

A further object of the present invention in accordance with the foregoing object, is to provide a filter circuit arrangement utilizing a plurality of transistor stages in which the base elements are connected in parallel through coupling capacitors to a D.C. source of potential of one polarity supplying cut-off voltage to each transistor stage, while the collector and emitter elements of each transistor are connected in series to a voltage source opposite in polarity while the collectors are connected through forwardly biasing resistors to the base elements in order to render the transistors conductive in a near saturation state by conducting a relatively high base current therethrough. A relatively small voltage difference between the collector and the emitter is thereby maintained so that the current handling capability of the filter circuit may virtually be limited only by the maximum current rating of the respective transistors. The high power handling capability of the filter circuit of the present invention therefore enables the use of small units with less restricting factors as to minimum or maximum voltages or currents being handled.

These together with other objects and advantages which will become subsequently apparent reside in the details of construction and operation as more fully hereinafter described and claimed, reference being had to the accompanying drawings forming a part hereof, wherein like numerals refer to like parts throughout, and in which:

Figure 1:
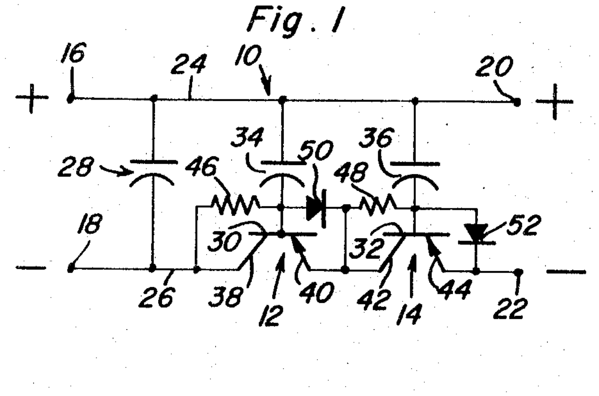
FIGURE 1 is a circuit diagram illustrating one form of filter arrangement in accordance with the present invention.

Referring now to the drawings, and initially to FIGURE 1 therein, it will be observed that the filter circuit generally referred to by reference numeral 10 is composed of a plurality of transistor stages, two stages 12 and 14 being illustrated for exemplary purposes only. The filter circuit is therefore connected at the input terminals 16 and 18 to a D.C. voltage source which is to be filtered while the output terminals 20 and 22 are to be connected to some load or additional filter stages as needed. The voltage source connected to the input terminals 16 and 18 will therefore have a direct component and ripple components which are to be filtered out.

Connected across the input terminals 16 between the voltage lines 24 and 26, is a storage capacitor 28 preceding the first stage 12 so as to initially smooth out the ripple voltage components. The ripple component of the D.C. voltage applied to the input terminals 16 and 18 is also applied to the base elements 30 and 32 of the transistor stages 12 and 14 through coupling capacitors 34 and 36 connected in parallel to the common input-output line 24 to which one potential side of the voltage source is connected, the positive side in the case of the arrangement illustrated in FIGURE 1. Each transistor stage therefore utilizes a transistor of the P-N-P type. The collectors and emitters of the transistors are connected in series between the input and output terminals 18 and 22, with the input terminal being connected to the potential side opposite in polarity which in the case of FIGURE 1 is the negative side. Accordingly, the voltage line 26 is connected to the collector 38 of the first transistor stage 12 while the emitter 40 thereof is connected to the collector 42 of the second transistor stage 14 with its emitter 44 being connected to the output terminal 22.

Signal voltage will therefore be supplied to the bases 30 and 32 of the transistor stages through the coupling capacitors 34 and 36 tending to vary transistor conductance reducing the signal at the emitters. The bases 30 and 32 are also heavily biased in a forward direction to near saturation by base current conducted through bias resistors 46 and 48 interconnected between the base and collector elements in each transistor stage. Also, interconnected between the base and emitter elements in each transistor stage, are in-rush current diodes 50 and 52, the back resistance of these diodes being such as to render them inactive for the most part and operative only to prevent any excessive cut off voltage from being applied to the base elements of the transistors.

Figure 2:
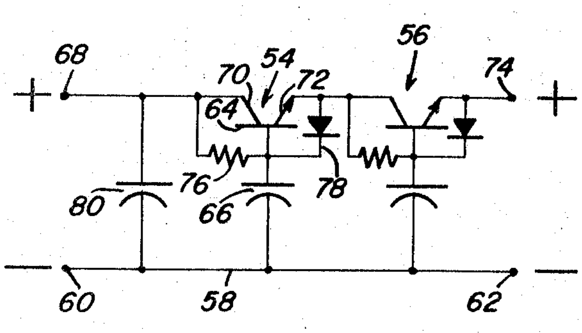
FIGURE 2 is a circuit diagram of an alternate filter circuit arrangement.

A similar filter circuit arrangement is illustrated in FIGURE 2 except that each of the transistor stages 54 and 56 utilizes a N-P-N type transistor. Accordingly, connections to the D.C. voltage source are reversed with respect to the filter circuit in FIGURE 1. The negative potential line 58 between the input terminal 60 and output terminal 62 is therefore connected in parallel to the bases 64 of the transistors through coupling capacitors 66 while the positive input terminal 68 is connected to the collector 70 of the transistor stage 54 having the emitter 72 on its output side. The collectors and emitters of the transistor stages are therefore connected in series between the positive input terminal 68 and the positive output terminal 74. Also, forward biasing resistors 76 are interconnected between the collectors and the bases while in-rush diodes 78 are interconnected between the emitters and the bases. Also, a storage capacitor 80 is connected across the input terminals 60 and 68 as in the case of the circuit in FIGURE 1.

It will be appreciated, that each of the transistor stages will be maintained conductive at near saturation conditions by applying a heavy forward bias to the base elements. The forward bias elements will therefore have a relatively low ohmic impedance in order to conduct therethrough a relatively high base current. The voltage difference between the collectors and the emitters is thereby maintained at a relatively low minimum value. Thus, the filter circuit will have a relatively low internal resistance and high power handling capability limited virtually only by the current rating of the transistor. Also, since the voltage difference between the collectors and the emitters is maintained low, relatively low heat losses will occur inasmuch as heat loss is approximately proportional to the product of the collector current and the voltage difference between the collector and emitter. It will also be appreciated, that the coupling capacitors will be effective to reduce the A.C. voltage signal component between the common input-output line and the output of the transistor in each stage so that its amplitude may approach zero at the output terminals of the filter circuit. Finally, it will be appreciated that the conductance of each transistor stage will depend upon the potential difference between the base and emitter which is thereby operative in response to ripple components in the input voltage applied to the collector, to limit any change in the potential difference caused by the change in voltage at the hum or ripple frequency.

Operation of the filter circuit may be summarized as follows: a D.C. voltage source is supplied to the input terminals 16 and 18 of the circuit illustrated in FIGURE 1 for example. The pulsations in this voltage are partially smoothed out by the storage capacitor 28 before any signal currents are supplied to the bases of the transistors through the coupling capacitors. The opposite voltage side connected to the collector of the first transistor stage, is also connected through the forward bias resistor to the base for conducting a relatively high base current as aforementioned. Should there be a simultaneous increase or decrease in the polarity of the opposite voltage sides as would occur when hum or ripple exists, the potential difference between the base and emitter will change in such a manner as to vary the conductance of the transistors in order to limit the change at the emitters to a small fraction, the inverse of which is the attenuation ratio. Attenuation ratios for each stage, of 30 to 1 have been obtained. Inasmuch as the bases of the transistors are connected in parallel to the common input and output, through the coupling capacitors, voltage difference changes due to ripple may be limited by substantially the same ratio in each stage with the over-all attenuation being the product of the attenuation ratios of the respective stages. Accordingly, with a two stage arrangement such as illustrated in FIGURE 1, ripple may be limited to $1/1000$ of its original value at the input terminals, approximately.

During the initial application of the input voltage to the filter circuit, the in-rush currents to the coupling capacitors tend to apply cut off voltage to the bases. The diodes 50 and 52 therefore present a conductive path for such in-rush currents so as to prevent the base elements 30 and 32 in the case of FIGURE 1 from becoming excessively positive. The diodes otherwise are inactive and in no way affect the filter circuit operational-wise.

From the foregoing description, it will be appreciated that the filter arrangement of the present invention is endowed by several desirable attributes. The use of a low bias resistance to effect forward base bias, results in a voltage difference between the collector and emitter of each transistor stage that is relatively low. Accordingly, the filter circuit will have relatively low heat losses and its current handling capability will be substantially equal to the maximum current rating of the transistors utilized. The connection of the transistor bases in parallel to the common input-output line through the coupling capacitors, with the collector and emitters being in series therebetween, enables each stage to produce approximately equal attenuation with the over-all attenuation being the product of the respective attenuation ratios. Low gain transistor stages may therefore be utilized. Also, the arrangement results in successive reduction in signal current amplitude, approaching zero so that noise at the output terminals may be referenced with respect to noise at the input of substantially the same phase. The filter circuit may therefore be designed to approach the perfect filter.

The foregoing is considered as illustrative only of the principles of the invention. Further, since numerous modifications and changes will readily occur to those skilled in the art, it is not desired to limit the invention to the exact construction and operation shown and described, and accordingly all suitable modifications and equivalents may be resorted to, falling within the scope of the invention as claimed.

What is claimed as new is as follows:

1. In combination with a source of voltage containing a direct component and a ripple component, a filter circuit comprising: a plurality of transistor stages, each stage including a base, a collector and an emitter, capacitive coupling means connecting the base of each stage in parallel to said voltage source for applying signal voltage to the base of each stage means connecting the collector and emitter of each stage in series with said voltage source, and forward biasing means connected only between the collector and the base in each stage establishing a relatively low ohmic impedance path for base current maintaining a minimum voltage difference between the collector and emitter in each stage.

2. The combination of claim 1 including means for limiting the voltage difference between the base and the emitter to prevent establishment of cut off voltage on the base in each stage.

3. A transistor filter circuit including a plurality of stages, each stage having input and output electrodes connected in series between input and output terminals of one polarity and a common voltage line of the opposite polarity coupled in parallel to control electrodes of said stages, wherein the improvement comprises a biasing resistor connecting the control electrode in each stage only to one of the input and output electrodes rendering the stage conductive with a minimum potential difference between the input and output electrodes, and signal coupling capacitors connected in parallel between the control electrodes and the common voltage line to vary the conductance of each stage in accordance with voltage deviations between the input terminal and the common voltage line to provide substantially equal attenuation ratios through said stages.

4. A filter circuit including a plurality of stages connected to voltage input terminals of opposite polarity, each stage having emitter and collector electrodes connected in series to one of the input terminals and a base electrode wherein the improvement comprises, means connecting the base elcetrode of each stage only to the collector electrode thereof for biasing the stage into a conductive state with a minimum potential difference between the emitter and collector electrodes, and signal coupling capacitors connected in parallel between the base electrodes and the other of the input terminals establishing attenuation at substantially equal ratios in each stage of any variations in voltage across said input terminals.

5. The combination of claim 4 including a diode interconnecting the emitter and base electrodes in each stage preventing establishment of a potential difference in one direction between the emitter and base electrodes.

6. In a filter circuit connected to a source of voltage containing a direct component and a ripple component, a transistor having a base, a collector and an emitter, capacitive coupling means connecting said base to the source of voltage for applying a signal voltage to said base from the ripple component of said source and preventing application of cut off potential from the direct component thereof, a forward biasing resistor connecting said base only to a potential opposite in polarity to said cut off potential for conducting saturating current maintaining the voltage difference between the collector and the emitter at a minimum, and a diode connecting the base to the emitter for limiting the potential difference therebetween.

References Cited by the Examiner

UNITED STATES PATENTS

| | | | |
|---|---|---|---|
| 2,995,697 | 8/1961 | Grenier. | |
| 3,105,933 | 10/1963 | Proc. | |
| 3,174,093 | 3/1965 | Finkelstein | 323—9 |
| 3,181,010 | 4/1965 | Cotton et al. | 330—18 X |
| 3,215,952 | 11/1965 | Massey | 331—113 |

JOHN F. COUCH, *Primary Examiner.*

W. E. RAY, G. GOLDBERG, *Assistant Examiners.*